(12) United States Patent
Itoh

(10) Patent No.: US 6,346,669 B1
(45) Date of Patent: Feb. 12, 2002

(54) SOLAR BATTERY UNIT AND SOLAR BATTERY APPARATUS

(75) Inventor: Katsuhiro Itoh, Tokyo (JP)

(73) Assignee: Misawa Homes Co., Ltd., Tokyo (JP)

( * ) Notice: Subject to any disclaimer, the term of this patent is extended or adjusted under 35 U.S.C. 154(b) by 0 days.

(21) Appl. No.: 09/582,641

(22) PCT Filed: Jun. 25, 1999

(86) PCT No.: PCT/JP99/03401

§ 371 Date: Jul. 28, 2000

§ 102(e) Date: Jul. 28, 2000

(87) PCT Pub. No.: WO00/03441

PCT Pub. Date: Jan. 20, 2000

(30) Foreign Application Priority Data

Jul. 8, 1998 (JP) .......................................... 10-193083

(51) Int. Cl.[7] .............................................. H01L 31/042
(52) U.S. Cl. ...................... 136/244; 136/251; 136/252; 136/256; 136/291
(58) Field of Search ................................. 136/244, 251, 136/252, 256, 291

(56) References Cited

U.S. PATENT DOCUMENTS

| | | | |
|---|---|---|---|
| 3,976,508 A | * 8/1976 | Mlavsky | 136/246 |
| 4,882,239 A | * 11/1989 | Grimmer et al. | 429/7 |
| 5,228,924 A | 7/1993 | Barker et al. | 136/246 |
| 6,060,658 A | * 5/2000 | Yoshida et al. | 136/291 |

FOREIGN PATENT DOCUMENTS

| | | | |
|---|---|---|---|
| DE | 43 24 698 | | 1/1995 |
| EP | 0 332 004 | | 9/1989 |
| JP | 51-54386 A | * | 5/1976 |
| JP | 51-54386 | | 5/1976 |
| JP | 51-65667 | * | 5/1976 |
| JP | 58-174100 A | * | 10/1983 |
| JP | 58-174100 | | 10/1983 |
| JP | 2-10667 | | 1/1990 |
| JP | 2-10667 A | * | 1/1990 |
| JP | 3-222372 A | * | 10/1991 |
| JP | 3-222372 | | 10/1991 |

* cited by examiner

*Primary Examiner*—Alan Diamond
(74) *Attorney, Agent, or Firm*—Oblon, Spivak, McClelland, Maier & Neustadt, P.C.

(57) ABSTRACT

Solar battery units 2 and 3 are formed in the shape of a void column, wherein at least, one part of the circumferential surfaces is prescribed as a light receiving surface 10. Simple installation is made possible either by direct securing to, or by simple placement on the place of installation. A pleasant outer appearance can be procured by concealing the wiring cables therein. Further, due to its capability of being positioned vertically or horizontally, methods of installation can be selected according to the conditions of the place of installation, permitting furthermore the installation irrespective of the inclination or the height of the place of installation by securing it directly to the place of installation. Composition of the solar battery apparatus 1 by connecting the solar battery units 2 and 3 in the longitudinal direction facilitates installation even in a small or narrow space.

11 Claims, 10 Drawing Sheets

F I G. 6
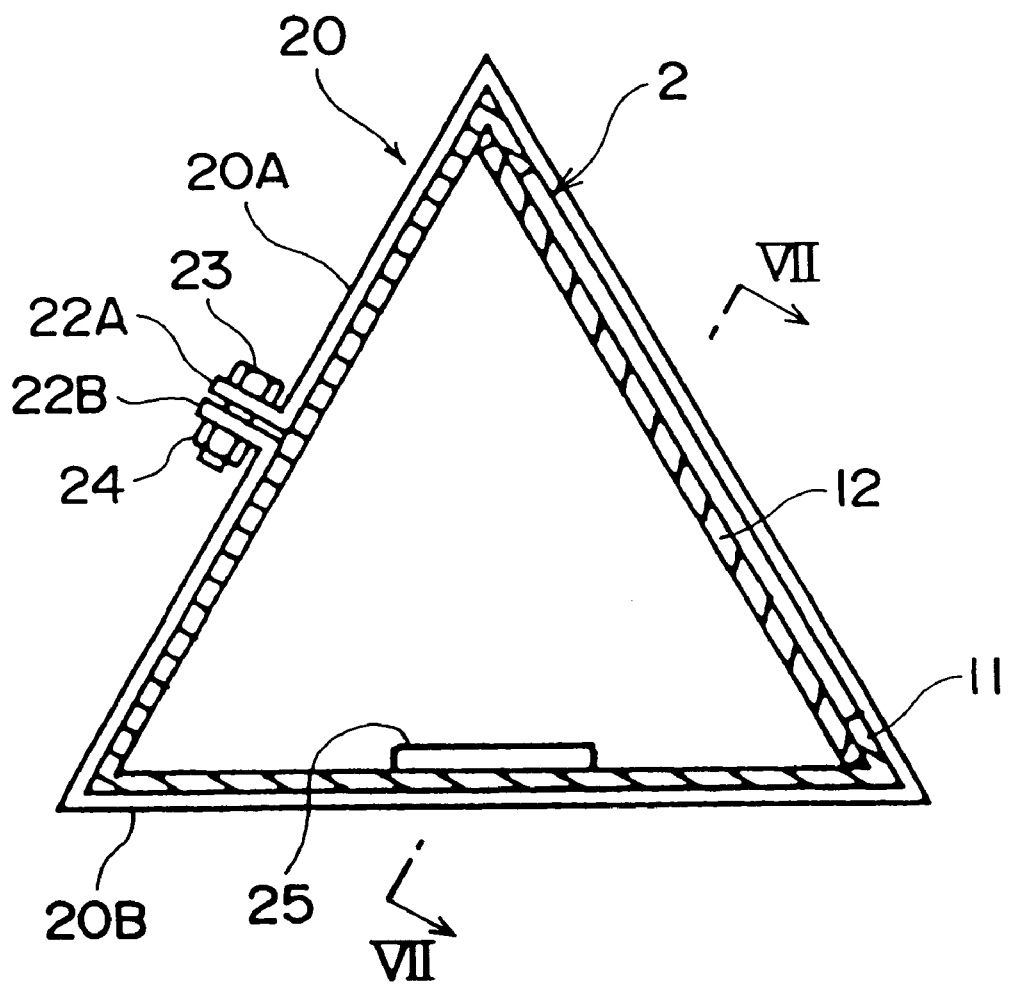

SOLAR BATTERY UNIT AND SOLAR BATTERY APPARATUS

BACKGROUND OF THE INVENTION

1. Field of the Invention

The present invention relates to a solar battery unit and a solar battery apparatus employing the solar battery unit.

2. Disscussion of the Background

Conventionally, a solar battery is used to effectively utilize solar energy for generating electricity.

When a solar battery is employed, a rectangular-shaped solar battery panel with a frame, within which are laid a prescribed number of solar battery cells, is generally used as a solar battery module, and the solar battery panels are installed on roofs, roads, grounds and so on. Such solar battery panels are often installed in an inclined position in order to effectively improve the light intake conditions.

Installation methods of the solar battery panels include the following:

(1) a method, wherein a pedestal is installed at the place of installation such as on roofs or grounds onto which the solar battery panels are secured.

(2) a method, wherein supporting rails are secured onto a roof sheathing board of a pitched roof along the tilted direction of the roof and onto the supporting rails are secured frames of the solar battery panels, whereby the solar battery panels serve at the same time as a roofing material. (Japanese unexamined patent publication Number 7-180310)

In the methods (1) and (2) described above, a gap is formed between the solar battery panels and the surface of the place of installation depending on the height of the pedestals from the supporting rails, enabling and electrical connections of the solar panels to be made in the gaps on the rear side thus provided.

When installing the solar battery panel on a flat plane with the above described method (1), the solar battery panel can be set at an inclined position by appropriately selecting the form of the pedestal by employing for instance a rightangled triangular section. However, setting the pedestal requires not only a space of a certain size, restricting the place of installation, but also involves other works such as manufacturing, transportation and installation of the pedestals in addition to the work required for the solar battery panels constituting the solar battery module at the time of installation, making the work more laborious. Moreover, if the pedestals are high, electrical wires are then exposed, giving an unpleasant outer appearance.

The method (2) described above poses a problem in that, since the method utilizes the solar battery panels as the roofing material of a pitched roof, the place of installation will be limited to a pitched roof and further, as is the case with the method (1), more laborious work is necessitated for manufacturing, transportation and installation of the supporting rails.

SUMMARY OF THE INVENTION

The object of the present invention is to provide a solar battery unit and a solar battery apparatus which enable a freer selection of the place of installation as well as facilitating the method of installation.

The battery unit of the present invention is formed in a void columnar shape, wherein at least a part of the circumferential surfaces is made to be a light receiving surface provided with a solar battery.

According to the present invention the solar battery unit is formed as a solar battery module in the shape of a column and at least one surface of the circumferential surfaces is made to be the light receiving surface. Thus, surfaces other than the light receiving surface can be directly secured to, or simply placed on the. place of installation, eliminating the need for the pedestals or supporting rails for installation, facilitating the installation process.

Furthermore, since the solar battery units are in the shape of a column, they can be laid with one part of the circumferential surfaces facing downwards, or they can be just as well be placed in an upright position with the longitudinal ends facing downwards. Accordingly, if the place of installation is small, they may be placed in an upright position, and if there is a height restriction at the place of installation, they may be placed on their sides. Consequently, the method of installation can be selected according to the conditions of the place of installation, giving a wider selection of the place of installation.

Moreover, by directly securing one surface other than the light receiving surface, to the surface of the place of installation, the solar battery units can be installed irrespective of the inclination or height of the place of installation, allowing for a wider choice of the place of installation than in conventional cases.

Furthermore, since the solar battery units are formed with a void inside, electric wiring can be stored and concealed within, resulting in a pleasant outer appearance.

Although the solar battery units are not restricted in the form as long as they are in the shape of a column, it is however preferable that they are comprised of frames made of polygonal-shaped columns and the solar batteries are provided on at least one surface thereof.

A polygonal-shaped column is a columnar body with sections in polygonal shapes such as triangular columns or square columns. The section of the polygon may also be an equilateral polygon, may however also be of other forms; by making one surface larger than the other surfaces, for instance would provide for a more stable surface for installation.

Utilization of such a polygonal-shaped column permits the composition of the circumferential surfaces to be entirely made of planes, enabling the connecting surface for direct securing or for simple placement to be composed of planes, insuring stability for installation and provide a simple and certain means for securing at a place difficult to install.

It is preferable that the solar battery units of the present invention be formed in the shape of a triangular column.

As for the solar battery units in the shape of a triangular column, various kinds of triangular sections such as an equilateral triangular section, a right-angled triangular section, an isosceles triangular section and the like may be adopted.

A good stability can thus be attained when one of the polygonal surfaces is faced downwards as a base plate at the place of installation. In particular, by way of making the triangular column to be of an equilateral triangle section and by securing one of the circumferential surfaces to vertical installation surfaces such as walls, the angle between the horizontal surface and the light receiving surfaces bear an angle of 30°, making the light intake to be more efficient.

Further, the solar battery apparatus of the present invention is constituted such that the above mentioned solar battery units are connected to each other in the longitudinal direction, wherein the adjoining solar battery units are mutually connected by joint members.

According to the present invention generation of electricity is made possible even when the place of installation is very small or long and narrow since the solar battery units are connected in the longitudinal direction. In other words, the solar battery units can be installed in a very small area if placed in an upright position and can also be installed in a narrow and long area if placed on their sides.

Furthermore, the solar battery units, as described above, can be installed without the use of a pedestal, facilitating the installation process and the possibility of placing wiring therein results in a pleasant exterior appearance.

The solar battery apparatus of the present invention is preferably provided with the joint members inside of which are inserted the ends of the solar battery units.

By doing so, the solar battery units can be easily connected and, since the ends of the solar units are stored inside of the joint members, the possibility of water seepage into the solar battery units can be prevented, securing the water proofing performance as well as protecting the inner wiring.

The solar battery apparatus of the present invention is preferably provided with the joint members with a packing material affixed to the inner surface thereof.

The solar battery units and the joint members can thus be tightly connected to each other, which results not only in a superior water proofing performance but due to the elimination of a play in the connecting portions, the connections can be made wobble-free.

According to the solar battery apparatus of the present invention it is preferable that both the plus terminals and the minus terminals that have been pulled out from the solar battery units are provided respectively on both longitudinal ends of the solar battery units.

By way of pulling out both the plus terminals and minus terminals from each end of the solar battery unit in this manner, the terminals can be selectively connected between the adjoining solar battery units, facilitating the connections either in series or in parallels.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 6 is a sectional view taken along the line VI—VI of FIG. 6;

DESCRIPTION OF THE PREFERRED EMBODIMENTS

One embodiment of the present invention will be described hereunder with reference to the drawings.

Figure 1:
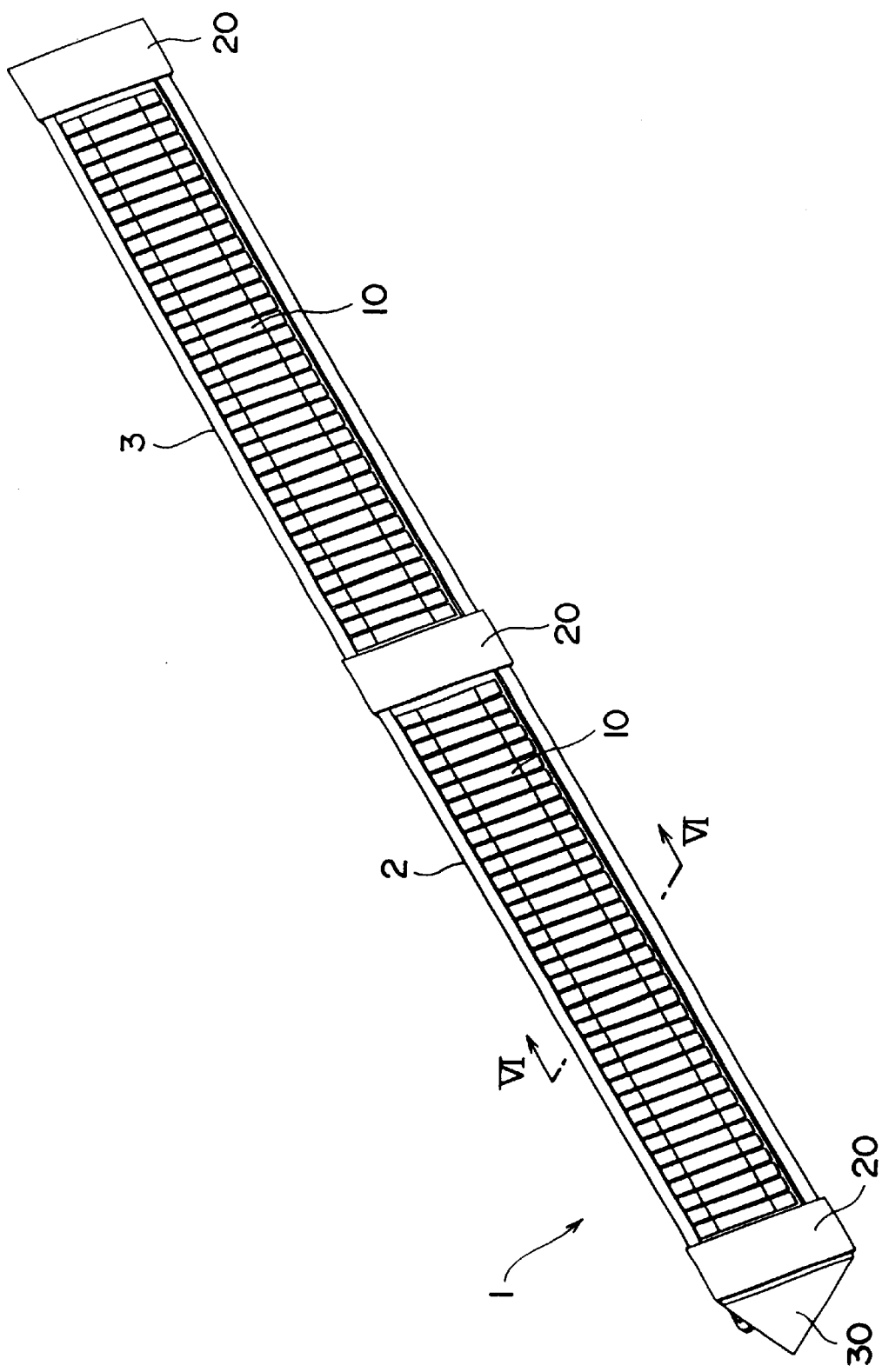
FIG. 1 is a perspective view of the first embodiment in accordance with the present invention.

FIG. 1 illustrates a solar battery apparatus 1 of the present embodiment. The solar battery apparatus 1 is a combination of two solar battery units 2 and 3, and comprises the solar battery units 2,3 and a joint member 20 which connects the solar battery units 2 and 3.

Figure 2:
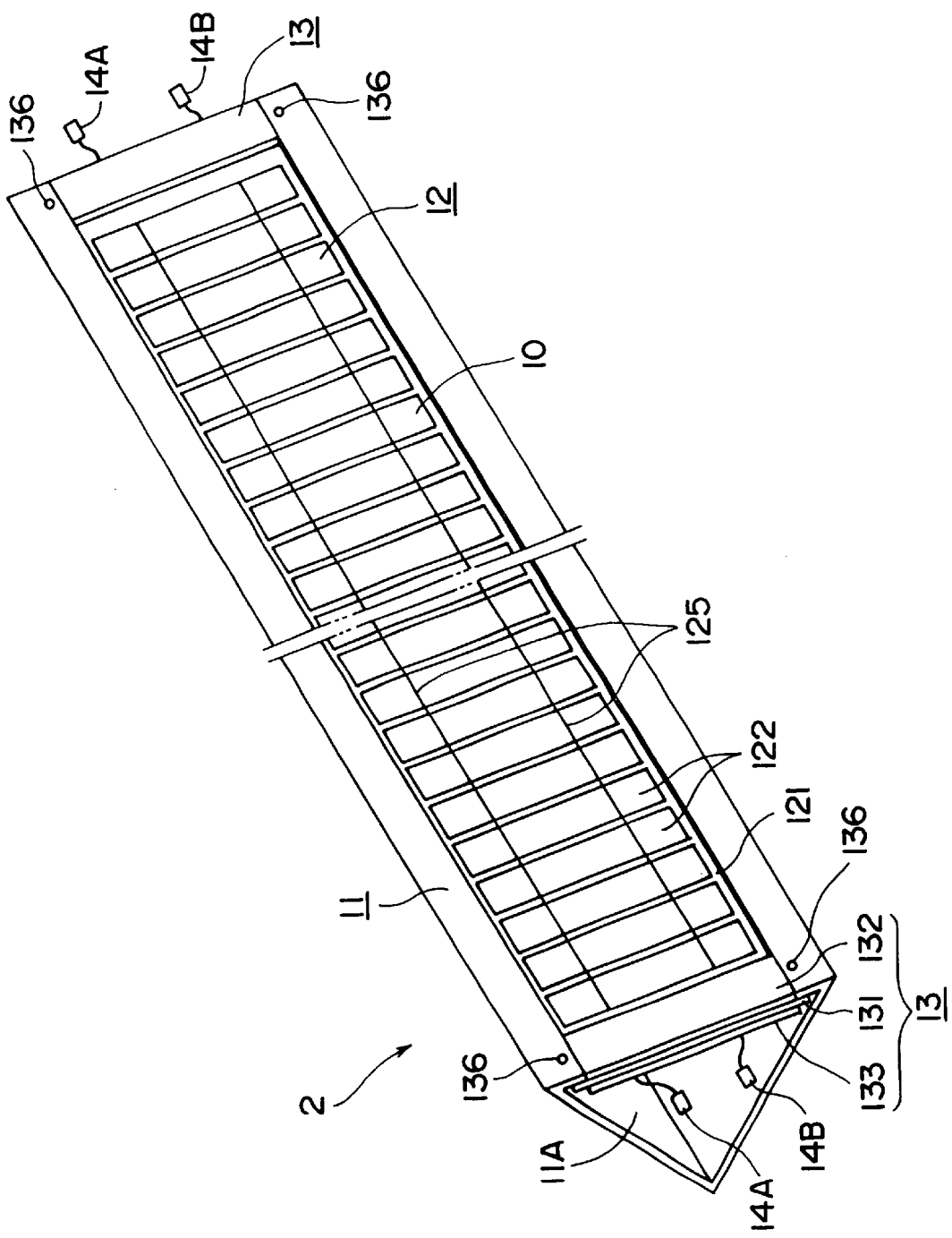
FIG. 2 is a perspective view of the solar battery unit of said embodiment.
Figure 3:
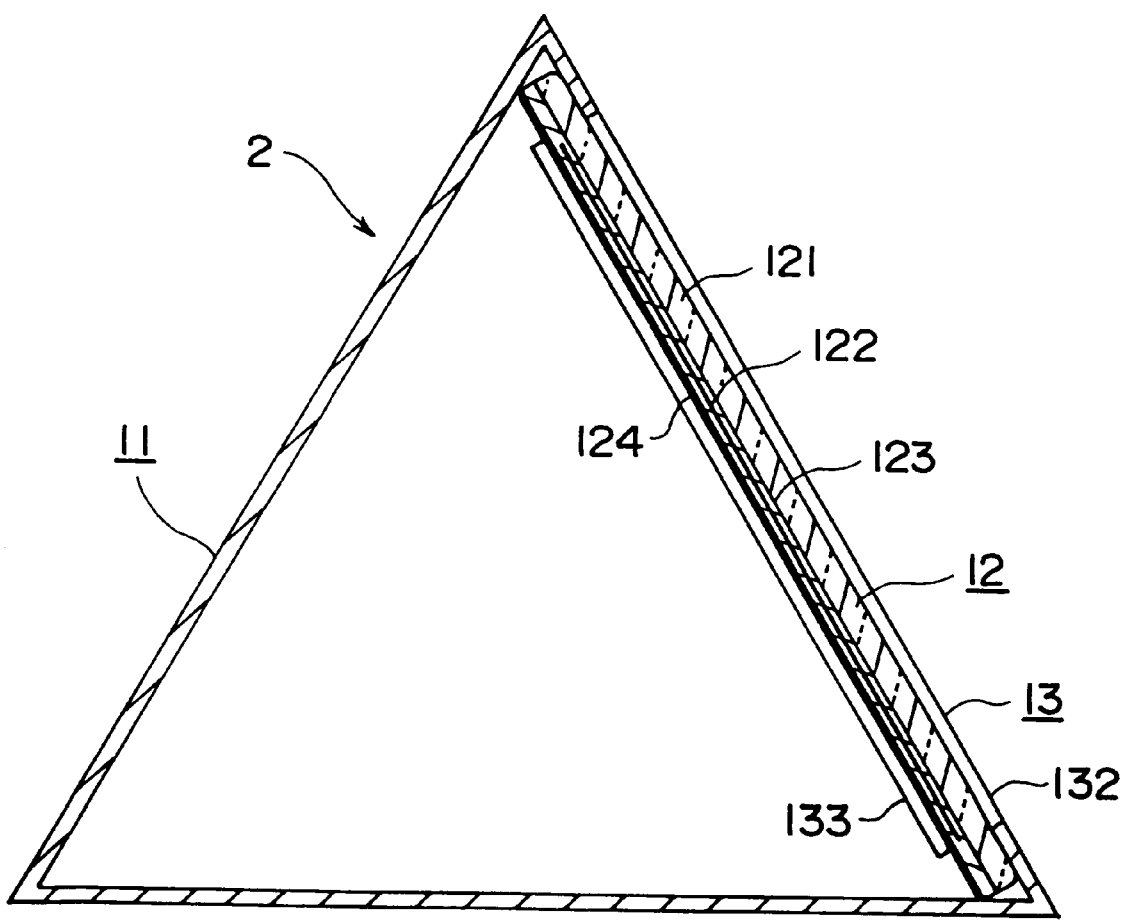
FIG. 3 is a sectional view of said embodiment of the solar battery unit.

The solar battery units 2 and 3 are formed in the shape of a triangular column of an equilateral triangular section and one of the three rectangular planes which comprise the circumferential surfaces is designated as a light receiving surface 10. Such solar battery units 2 and 3 are formed with a void comprising a frame 11 in the shape of a triangular column with a void section 11A and a solar battery 12 provided on one surface of the frame 11, as illustrated in FIG. 2 and FIG. 3.

The frame 11 is built with a metal such as aluminum in the shape of a triangular column of an equilateral triangular section, and one of the three surfaces which is to become the light receiving surface 10 is open, and the solar battery 12 is integrated and concealed into this opening.

A glass substrate 121 and a plurality of solar battery cells 122 concealed therein constitute the solar battery 12 and comprise, as a supporting member, the glass substrate 121 in the form of a rectangular plane, a plurality of solar battery cells 122 arranged on one side of the substrate 121, a transparent filling material 123 to seal in the solar battery cells 122, and a back coating material 124 for covering the filling material 123.

The solar battery cells 122 are comprised of single crystal silicon solar batteries and are electrically connected within the solar batteries 12 by means of band-shaped metallic foils 125 connected either in series or in parallels. It should be noted that the solar battery cells 122 may be composed of polycrystal silicon solar cells or amorphous silicon solar cells.

The filling material 123 is comprised of a transparent resin such as EVA(Ethylene Vinyl Acetate) with a high moisture resistance, or PVA(Poly Vinyl Butylol) with a reduced loss of ultra violet light transmission rate. In order to secure sufficient resistance against moisture, the reversed side of the substrate 121 of the filling material 123 is covered with a back coating material 124 made of a resin such as polyvinyl fluoride.

At both longitudinal ends of such solar batteries 12 are attached connecting members 13 in order to secure the solar batteries 12 to the frame 11.

Figure 4:
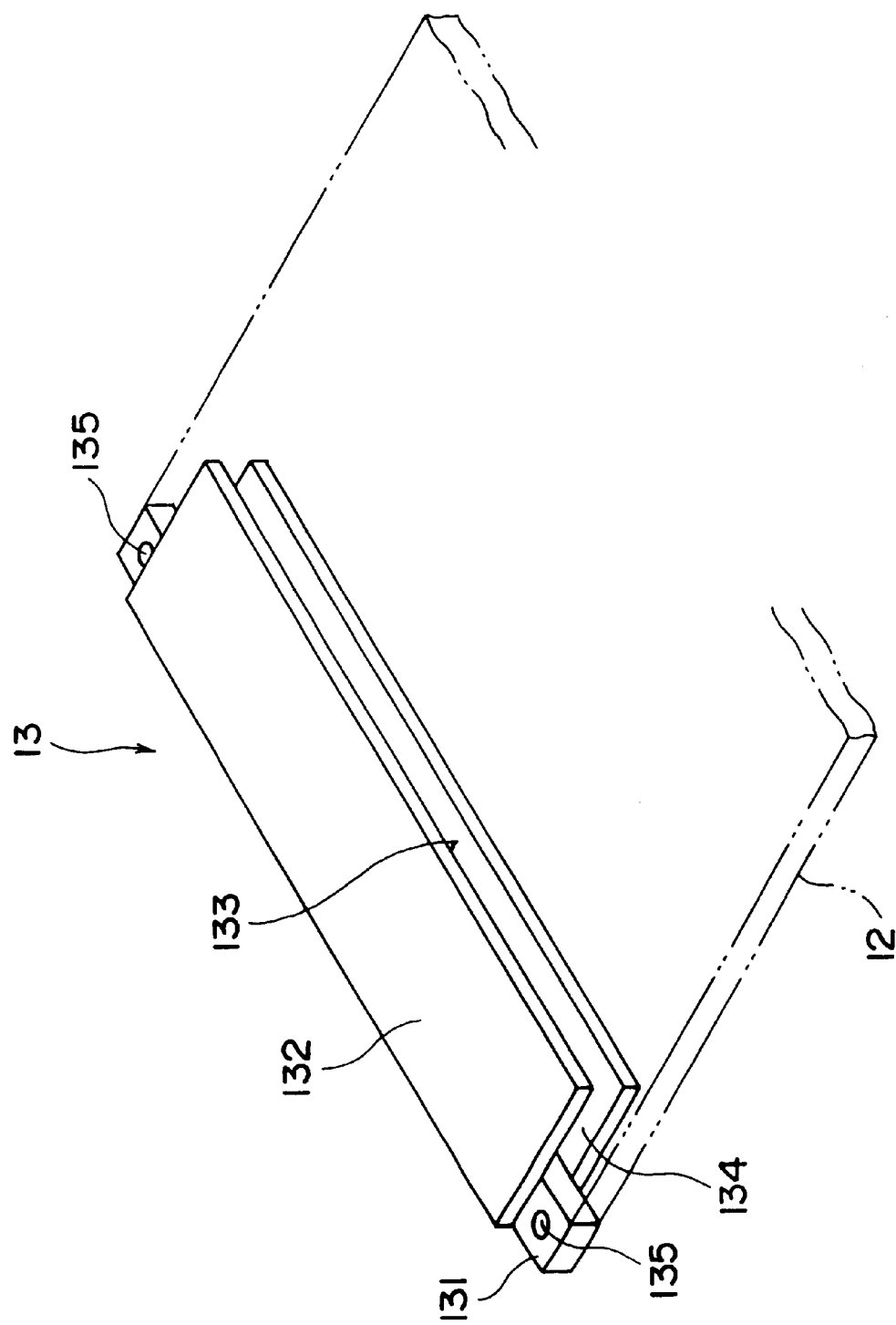
FIG. 4 is a perspective view of the connecting member of said embodiment.

The connecting members 13, as illustrated in FIG. 4, comprise a fixed part 131 in the shape of a rectangular column and securing members 132 and 133 having rectangular plates to embrace the fixed part 131 and has a section in the form of the letter U. The fixed part 131 and the securing members 132 and 133 are integrated into one member by means of welding and the longitudinal ends of the solar batteries 12 are inserted into the gap 134 between the securing members 132 and 133. The fixed part 131 is formed such that it protrudes from the pressure members 132 and 133 and securing holes 135 are provided at both protruded end parts of the fixed part 131.

The solar batteries 12 are secured to the frame 11 from the inside thereof through the connecting members 13 so as to close off the opening. In other words, it is secured by inserting the screws 136 into the securing holes 135 of the connecting members 13 from the side of the frame 11.

Referring again to FIG. 2, the solar battery units 2 and 3 are respectively provided at both longitudinal ends with plus terminals 14A and minus terminals 14B, which are pulled out of the solar batteries 12, allowing the terminals 14A and 14B,lead wires, not shown, and the like of the adjoining solar batteries 2 and 3 to be connected.

Figure 5:
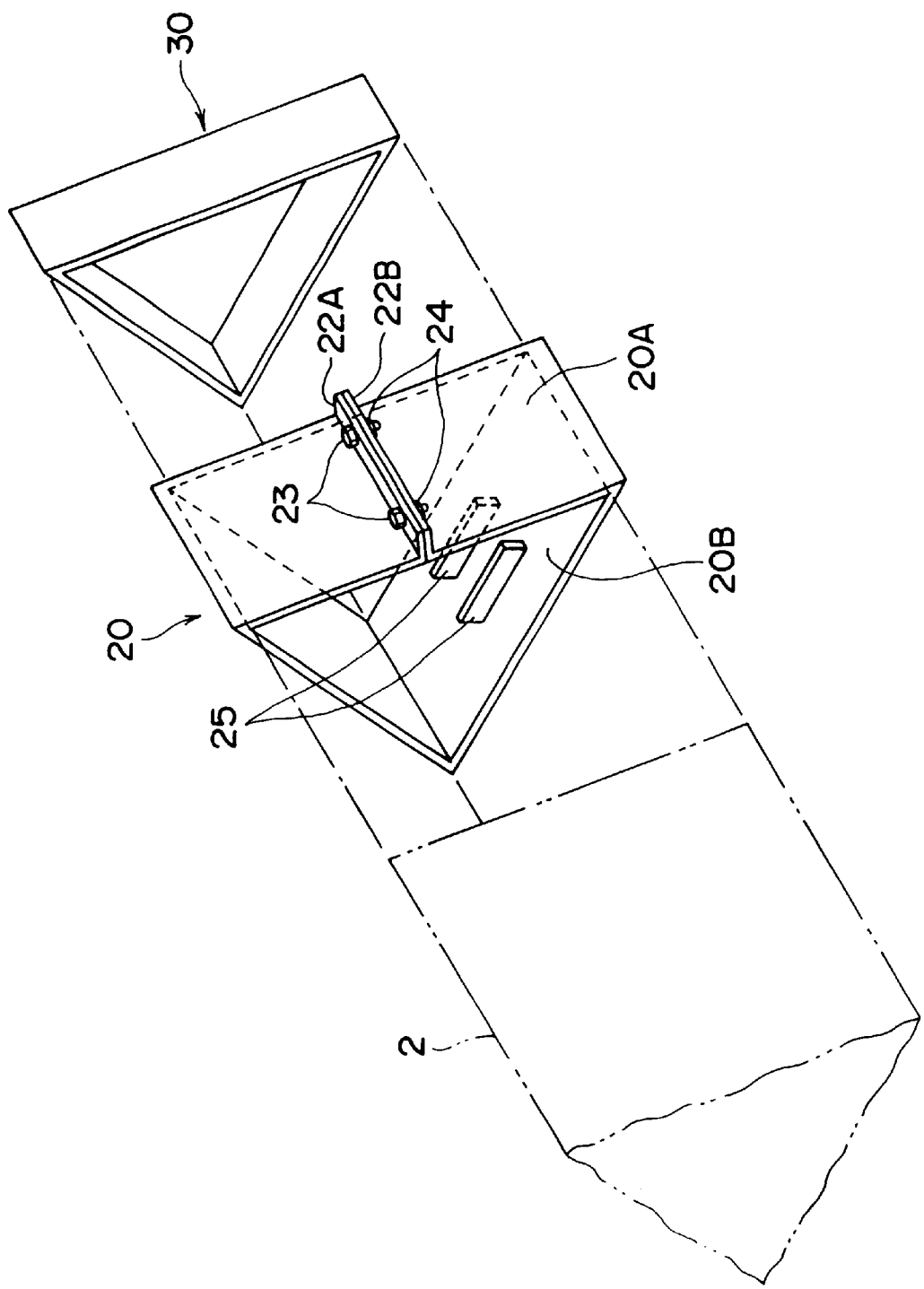
FIG. 5 is an exploded perspective view of the joint member and the cover member of said embodiment.

On the other hand, the joint members 20, as illustrated in FIG. 5 and FIG. 6, are in the shape of a triangular column (triangular frame) corresponding to the triangular section of the solar battery units 2 and 3, and is formed broadening in the axial direction so that the ends of the solar battery units 2 and 3 can be inserted from both sides.

Of the three surfaces of the joint member 20, one surface is made to be an adjusting surface 20A for securing the solar battery units 2 and 3. The adjusting surface 20A is divided in the middle in the axial direction and the divided portions are provided with connecting surface 22A and 22B laid parallel to each other and rising outwardly from each of the divided surfaces. The connecting surfaces 22A and 22B are connected by means of bolts 23 and nuts 24.

Either of the two surfaces other than the adjusting surface 20A of the joint member 20 is to be a position-determining surface 20B and is provided with stoppers 25 for determining the positions of the solar battery units 2 and 3. The stoppers 25 are affixed vertically to the inside of the joint member 20, band-shaped and in two rows orthogonal to the axial direction of the joint member 20 and fixes the positioning of each of the abutting solar battery units 2 and 3 inserted from both sides.

The joint member 20 is provided inside with a sheet-shaped packing material, not shown.

The packing material is comprised of an elastic material such as elastomer or synthetic resin and the joint member 20 is tightly connected to the solar battery units 2 and 3 via the packing material.

Figure 7:
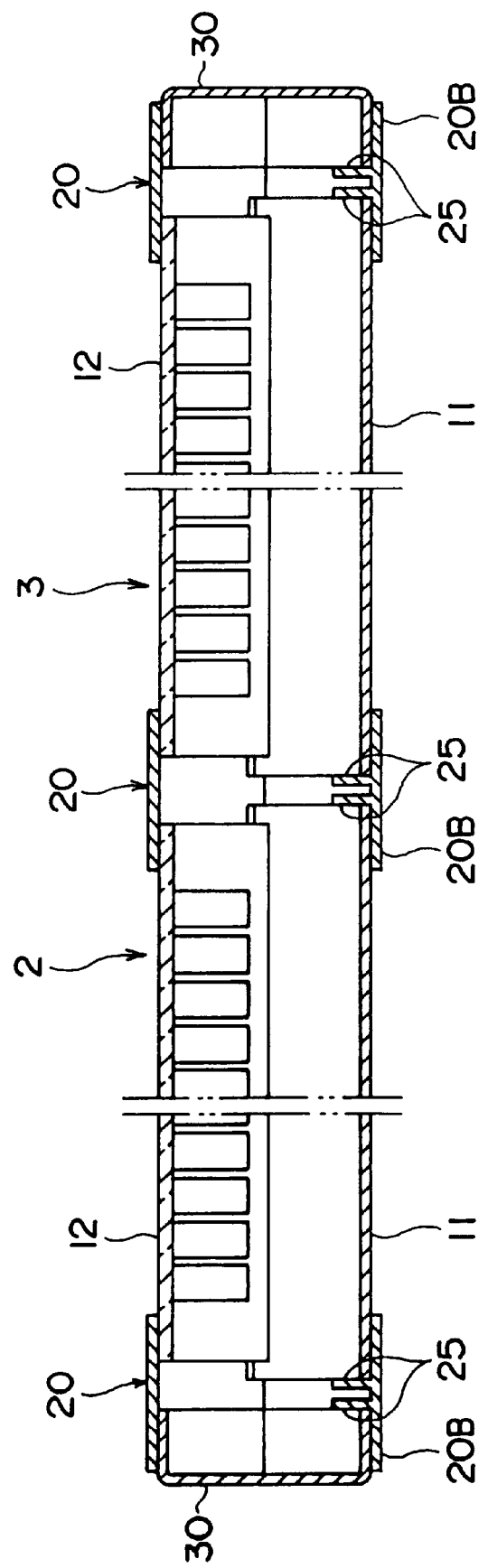
FIG. 7 is a sectional view taken along the line VII—VII of FIG. 6.

The joint members 20, as shown in FIG. 7, are not only provided between the solar battery units 2 and 3 to connect the both ends but are also provided at the opposite ends of the connecting side, namely, at both extreme ends of the solar battery apparatus 1. Cover members 30 are inserted into the joint members 20 at the extreme ends.

The cover members 30 are formed like a cap of an equilateral triangular section, similar to the form of the frame 11 and are secured inside of the joint members 20, by being inserted and abutting the stoppers 25.

Though FIGS. 2,3,5 and 6 illustrate only the solar battery unit 2, the solar battery unit 3 is evecuted in the similar manner.

The solar battery apparatus 1 of the present embodiment with the above mentioned components is assembled in the following manner:

When connecting the solar battery units 2 and 3, the plus terminals 14A and minus terminals 14B of the two solar battery units 2 and 3 are selectively connected to each other. In other words, when they are to be connected in series, the plus terminals 14A and the minus terminals 14B are connected to each other and when they are to be connected in parallels, the plus terminals 14A are connected to each other and the minus terminals 14B are connected to each other. This wiring work is executed after the terminals 14A and 14B of either of the solar battery units 2 or 3 have been put through the joint member 20.

The wiring cables will then be stored away in the solar battery units 2, 3 and the joint member 20. The ends of the solar battery units 2 and 3 are inserted from both sides of the joint member 20, through which the terminals 14A and 14B run, and abut the stopper 25 respectively. The solar battery units 2 and 3 are then fixed at the prescribed positions. The bolts 23 are in this state inserted into the holes of the connecting surfaces 22A and 22B and the nuts 24 are screwed in, connecting the surfaces 22A and 22B. When the bolts 23 and nuts 24 are tightened, the ends of the solar battery units 2 and 3 are compressed against the joint member 20 through the packing material, not shown, leading to a tight connection of the solar battery units 2, 3 and the joint member 20.

Furthermore, the joint member 20 is provided on the opposite ends of the connecting surfaces of the solar battery units 2 and 3, namely at each end of the solar battery units 2 and 3 which form the ends of the solar battery apparatus 1, and the openings of the joint members 20 on the other side of the solar battery units 2 and 3 are enclosed with the cover members 30.

In other words, just as in the case where the above mentioned solar battery units 2 and 3 are connected to each other, the solar battery units 2, 3 and the cover members 30 are inserted from both sides of the joint members 20, and the connecting surfaces 22A and 22B are secured in this state by means of the bolts 23 and nuts 24 after having been positioned by abutting the stoppers 25.

At this time terminals 14A and 14B on the side of the cover members 30 of the solar battery units 2 and 3 are to be pulled outside and connected to lead wires, not shown. The lead wires may be used to connect to a battery, condenser and the like to store the electric energy, or to be used to provide electricity directly to an electric appliance through inverters and so on.

The solar battery apparatus 1 thus obtained by connecting the solar battery units 2 and 3 can be installed at various places.

To be more precise, the solar battery apparatus 1 can be installed, as illustrated in FIG. 1, on a fairy horizontal plane, such as on the ground, balcony, top area of a fence, top area of a handrail, top area of a guard-rail and so on, and in this case, the solar battery apparatus 1 may be simply set on the place of installation, or the bottom surface thereof may be secured by means of fastening materials such as screws and nails, or glued together by means of an adhesive.

Figure 8:
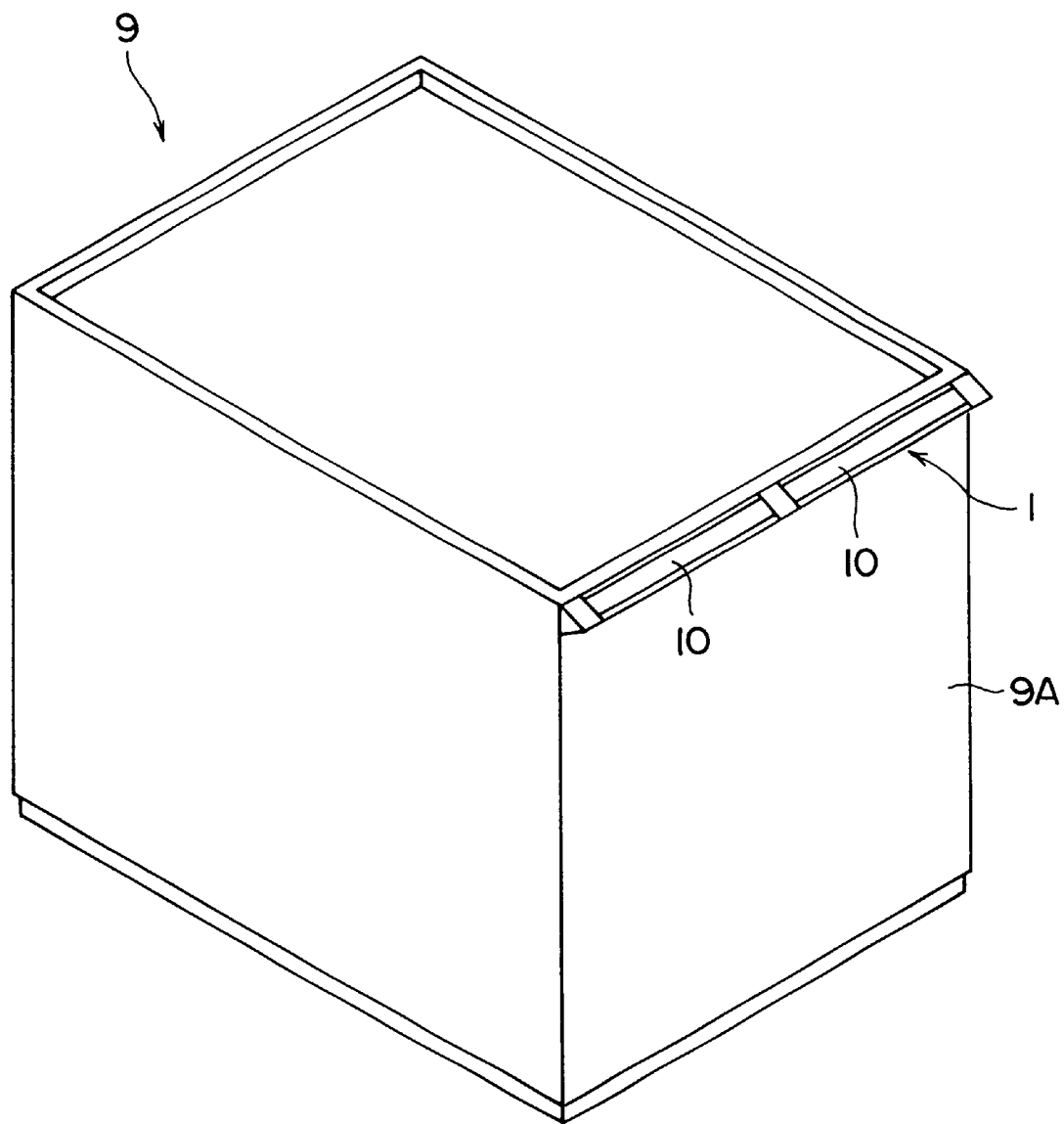
FIG. 8 is a perspective view of the state of installation of the solar battery apparatus of said embodiment.

One surface of the solar battery apparatus 1 may also be secured, as illustrated in FIG. 8, such that the light receiving surface 10 faces upwards in relation to the vertical surface of walls and the like of a building 9.

When the solar battery units 2 and 3 are secured horizontally to a vertical surface of a wall 9A and the like, the angle which the light receiving surface 10 bears with the horizontal plane becomes 30° which is the most effective light receiving angle, resulting in a simplified installation method in addition to being able to procure a high electricity generation efficiency. Furthermore, when the solar battery units 2 and 3 are secured on the upper end of the wall 9A, the solar battery apparatus 1 can also be utilized as a canopy.

As regards the installation, securing the joint members 20 to the wall 9A by means of fastening devices such as screws and nails or bonding it by means of an adhesive will secure the solar battery apparatus 1.

It should be noted that, since the adjusting surfaces 20A of the joint members 20 comprise protruding parts consisting of the connecting surfaces 22A, 22B, bolts 23 and nuts 24, the surface to be used for securing to the wall 9A should be, of the 3 surfaces of the joint members 20, either of the two remaining surfaces other than the adjusting surface 20A.

Further, when the solar battery apparatus 1 is to be secured to a wall such as 9A, either of the remaining 2 surfaces other than the adjusting surfaces 20A of the joint members 20 should be secured to the wall 9A, and the solar battery units 2 and 3 may be inserted into the fixed joint members 20, whereby the solar battery apparatus 1 can be installed while being assembled.

Installation of the solar battery apparatus 1 in a vertical state can easily be realized by either simply placing it or by securing it with the end surface of the cover member 30 as a base which enables the installation even when the installation space is very limited.

The place for installation is not limited in any special way and installation can be executed on the ground, balconies, roads, parks, gardens and so on.

Figure 9:
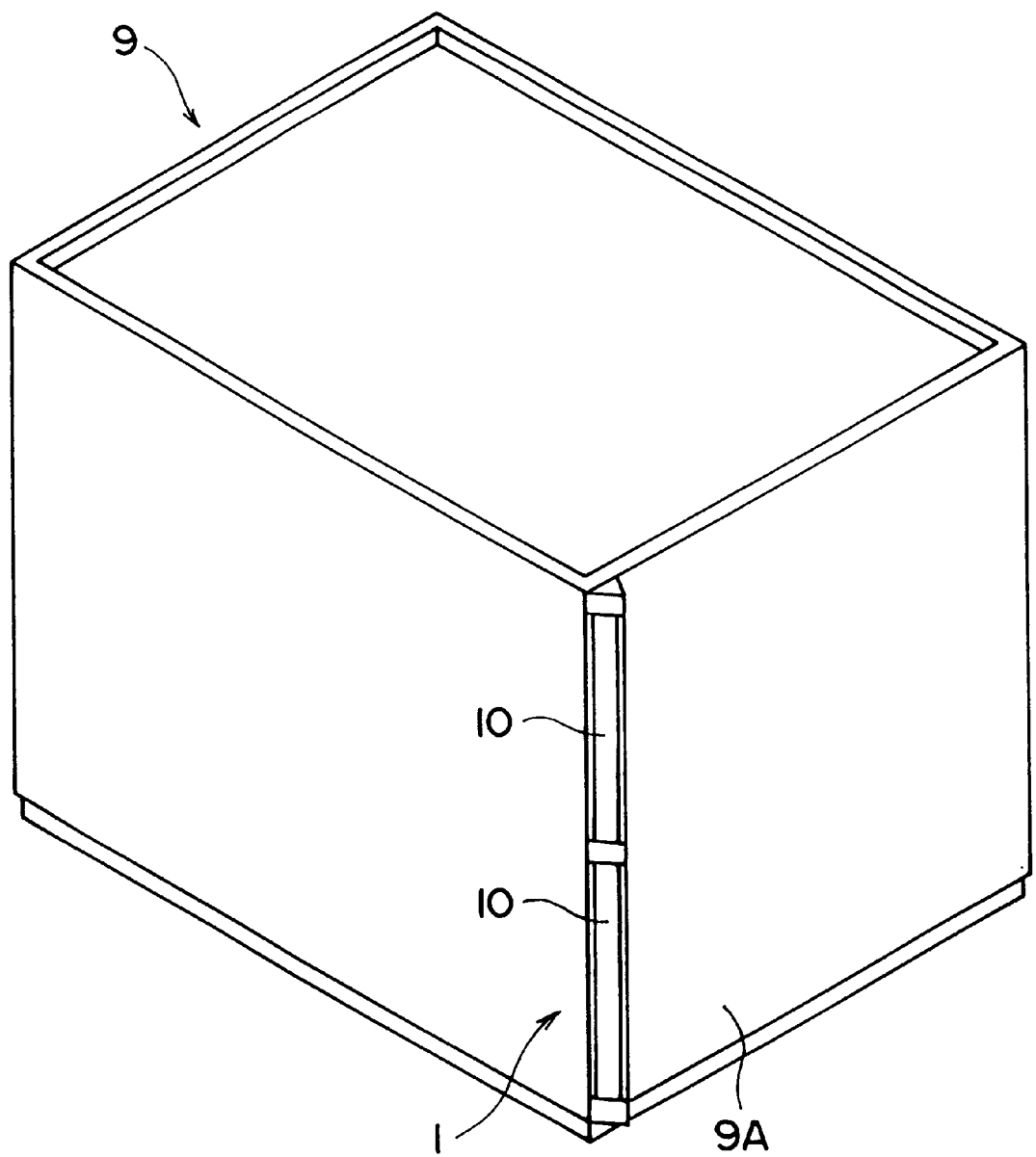
FIG. 9 is a perspective view of another state of installation of said embodiment.
Figure 10:
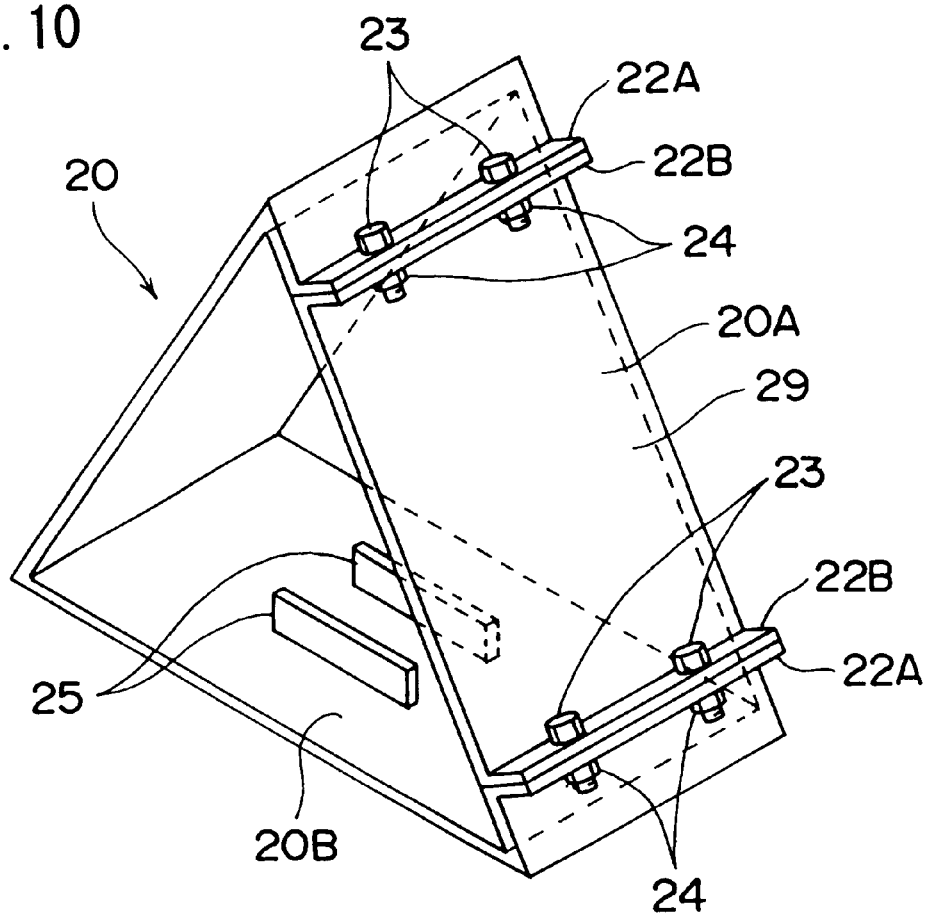
FIG. 10 is a perspective view of another joint member of the present invention.
Figure 11:
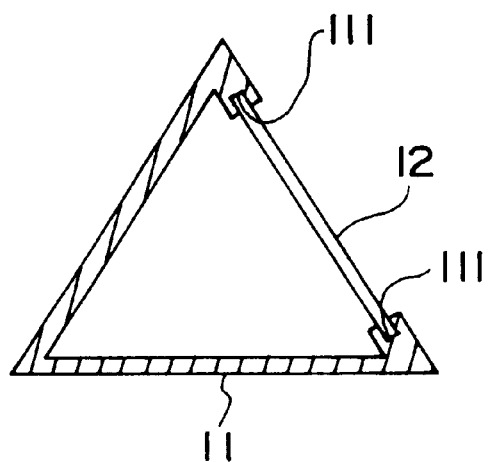
FIG. 11 is a sectional view of another installation method of the solar battery of the present invention.

The solar battery apparatus 1 can also be secured, as illustrated in FIG. 9, on a vertical surface of the wall surface 9A or a fence similar to the case when it was secured horizontally( laterally ). In this case either of the two surfaces other than the light receiving surface 10 may be used as the securing surface and the securing surface may be so set that the direction of the light receiving surface 10 is adjusted to the most effective light receiving angle. Moreover, the joint members 20 should be so placed that a flat exterior surface, namely either of the surfaces other than the adjusting surfaces 20A, come in contact with the securing surface.

The solar battery apparatus 1 can be used for the purpose of illumination,as emergency electric generator in case of disaster, and when fixed to a vehicle such as an automobile or a tramcar, it can be used to directly supply electricity to the electric appliances of the vehicle.

The present embodiment offers the following effects.

Since the solar battery units 2 and 3 are, as a solar battery module, are columnar in shape and one part of the circumferential surfaces is designated to be the light receiving surface 10, a surface other than the light receiving surface 10 may be used for the purpose of simple placement or direct securing of the solar battery units 2 and 3, whereby a pedestal or supporting rails needed otherwise for installation can be eliminated, simplifying the installation process.

Furthermore, since the solar battery units 2 and 3 are columnar in shape, it can be laid with one part of the circumferential surfaces facing downwards or it can also be placed upright with one longitudinal end facing downwards. Accordingly, it can be installed upright if the installation place is for instance small, or placed horizontally if the height of the places of installation is for instance restricted, which allows the installation method to be selected according to the conditions of the place of installation, widening the freedom of choice of the place of installation.

Furthermore, when the solar battery apparatus 1 is to be directly secured via the surface other than the light receiving surface 10, it can be accomplished even when the place for installation is small, and since it can be secured irrespective of the inclination or height of the place of installation, a greater choice of the place for installation can be offered. Furthermore, since the solar battery units 1 and 2 are void inside, wiring cables can be stored away and concealed, resulting in a pleasant outer appearance.

Furthermore, since the frame 11 is all composed of planes on the circumference, the securing surface for securing, or the base plane for simple placement can be flat, providing for a stable condition for installation and facilitates installation even when the ground is not, for instance, very adequate for this purpose.

In particular, since the solar battery units 2 and 3 are formed in a triangular columnar shape of an equilateral triangular section, a superior stability is obtained when laid approximately horizontally as illustrated in FIG. 1. Further, when one of the circumferential surfaces is fastened to a vertical installation surface such as a wall, as illustrated in FIG. 8, the angle between the horizontal plane and light receiving surface 10 becomes 30°, making the light collection to be particularly effective.

Further, since the solar battery units 2 and 3 are connected together in the longitudinal direction, installation can be implemented effectively by placing it horizontally or vertically according to various conditions of the place of installation such as the area for installation is limited in size, which would result in the high electricity generation efficiency.

Furthermore, since the ends of the solar battery units 2 and 3 are to be inserted into the joint members 20, the solar battery units 2 and 3 can be easily connected, and as the ends of the solar battery units 2 and 3 can be stored away inside of the joint members 20, water penetrating into the solar battery units 2 and 3 will be reduced, thereby securing the water proofing property and providing simultaneously a protection to the inner wiring.

Moreover, since packing materials, not shown, are provided on the inner surfaces of the joint members 20, a tight seal can be obtained between the solar battery units 2,3 and the joint members 20, giving rise to a high grade of water proofing property and the parts can be connected wobble-free due to elimination of a play in the connections.

Further, since both the plus terminals 14A and the minus terminals 14B are pulled out from each end of the solar battery units 2 and 3, the terminals 14A and 14B can be selectively connected between the adjoining solar battery units 2 and 3, facilitating the procedure of connections in either series or parallels.

It should be noted that the present invention is not only limited to the embodiment above described but includes other structures which would attain the objects of the present invention, and include such variations as shown below.

Although the present embodiment describes a case where two solar battery units are connected to each other, it can just as well be 3 units or more, or even a single solar battery can be employed by itself: the number of the solar battery units may thus be selected according to the actual situations.

Further, although the solar battery units 2 and 3 of the above described embodiment is a triangular column in shape, it may just as well be a square, pentagonal or polygonal column or even be cylindrical in shape.

Further, the adjusting surface 20A of the joint member is not confined to a bisection, but the intermediate part of the adjusting surface 20A may be made of a detachable member, namely a cover member 29 and thereby making the adjusting surface 20A openable. This provides a good workability when either of the remaining 2 surfaces has to be secured from the inside to the surface of installation.

Furthermore, as regards the securing method of the solar batteries 12 to the solar battery units ( 2, 3 and the like), it is not limited to the use of the connecting member 13 of the above described embodiment and any component known in the art may be adopted. For instance, as illustrated in FIG.

11, a groove 111 corresponding to 71 the thickness of the solar batteries 12 may be provided on the inner surface of the opening for securing the solar battery 12 of the frame 11, and the solar batteries 12 may be secured by having the edges inserted into the groove 111. This is, so to speak, an integration of the connecting member 13 and the frame 11. Such a profile can easily be manufactured by utilizing a conventional production method for window sashes if the frame 12 is to be molded in aluminum by a pultrusion method. The groove 111 may be molded such that it is slightly wider than the thickness of the solar batteries 12, allowing for a packing material such as rubber to be inserted therebetween.

As described above, the solar battery unit and the solar battery apparatus according to the present invention serves effectively as a photovoltaic power generator and can be effectively employed in a house, building or any other fixed structures.

What is claimed is:

1. A solar battery unit comprising:
   a void column, wherein at least a part of the circumferential surfaces of said void column is formed as a light-receiving surface provided with a solar battery that is attached to a frame to close an opening from inside said void column.

2. A solar battery unit according to claim 1, wherein the solar battery unit is formed in a shape of a void polygonal column, and at least one surface of said frame is provided with the solar battery.

3. A solar battery unit according to claim 2, wherein said solar battery unit is formed in the shape of a void triangular column.

4. A solar battery apparatus, wherein solar battery units according to claim 1 are connected in a longitudinal direction and adjoining solar batteries are connected via joint members.

5. A solar battery apparatus according to claim 4, wherein end parts of said solar battery units are inserted inside said joint members.

6. A solar battery apparatus according to claim 5, wherein a packing material is provided on inner surfaces of said joint members.

7. A solar battery apparatus according to claim 4, wherein both longitudinal ends of said solar battery units are provided with both plus terminals and minus terminals which have been pulled out from bodies of the adjoining solar batteries.

8. A solar battery apparatus, wherein solar battery units according to claim 2 are connected in a longitudinal direction and adjoining solar batteries are connected via joint members.

9. A solar battery apparatus, wherein solar battery units according to claim 3 are connected in a longitudinal direction and adjoining solar batteries are connected via joint members.

10. A solar battery apparatus according to claim 5, wherein both longitudinal ends of said solar battery units are provided with both plus terminals and minus terminals which have been pulled out from bodies of the adjoining solar batteries.

11. A solar battery apparatus according to claim 6, wherein both longitudinal ends of said solar battery units are provided with both plus terminals and minus terminals which have been pulled out from bodies of the adjoining solar batteries.

* * * * *